(12) United States Patent
Wild

(10) Patent No.: US 7,102,356 B2
(45) Date of Patent: Sep. 5, 2006

(54) ELECTRICAL LEAKAGE DETECTION CIRCUIT

(75) Inventor: Arthur Wild, Chillicothe, IL (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 10/742,884

(22) Filed: Dec. 23, 2003

(65) Prior Publication Data

US 2005/0146335 A1    Jul. 7, 2005

(51) Int. Cl.
    *G01R 31/14*    (2006.01)
(52) U.S. Cl. ...................................... 324/510
(58) Field of Classification Search ............. None
    See application file for complete search history.

(56) References Cited

U.S. PATENT DOCUMENTS

| | | | | |
|---|---|---|---|---|
| 3,786,466 A | 1/1974 | Naito et al. | ........... | 340/651 |
| 4,147,982 A * | 4/1979 | Emery | ........... | 324/510 |
| 5,382,946 A | 1/1995 | Gale | ........... | 340/650 |
| 5,481,194 A | 1/1996 | Schantz et al. | ........... | 324/522 |
| 5,561,380 A | 10/1996 | Sway-Tin et al. | ........... | 324/509 |
| 5,754,114 A | 5/1998 | Gnadt | ........... | 340/649 |
| 5,818,236 A * | 10/1998 | Sone et al. | ........... | 324/509 |
| 6,541,980 B1 * | 4/2003 | Maki | ........... | 324/426 |

OTHER PUBLICATIONS

Schematic entitled "M80D Logic Board AS.", Feb. 9, 1989, Arthur Wild.

* cited by examiner

*Primary Examiner*—Vincent Q. Nguyen
(74) *Attorney, Agent, or Firm*—Finnegan, Henderson, Farabow, Garrett&Dunner LLP

(57) ABSTRACT

A method is provided for detecting electrical leakage between a power supply and a frame of a vehicle or machine. The disclosed method includes coupling a first capacitor between a frame and a first terminal of a power supply for a predetermined period of time. The current flowing between the frame and the first capacitor is limited to a predetermined current limit. It is determined whether the voltage across the first capacitor exceeds a threshold voltage. A first output signal is provided when the voltage across the capacitor exceeds the threshold voltage.

19 Claims, 1 Drawing Sheet

ELECTRICAL LEAKAGE DETECTION CIRCUIT

U.S. GOVERNMENT RIGHTS

This invention was made with government support under the terms of Contract No. DE-FC04-2000AL67017 awarded by the Department of Energy. The government may have certain rights in this invention.

TECHNICAL FIELD

This invention relates generally to electrical leakage detection systems, and more particularly, to frame electrical leakage path detection systems in vehicles and machinery.

BACKGROUND

A high voltage DC electrical power supply in a vehicle or piece of machinery presents a potential safety hazard to an individual when a leakage path exists between a terminal of the power supply and a frame of the vehicle or machinery. Typically, the vehicle or machinery frame will be electrically isolated from the terminals of the high voltage power supply. If an individual was to simultaneously touch one terminal of the power supply and the frame, the individual would be safe if the power supply remained isolated from the frame. As long as no electrical leakage path exists between the other terminal of the power supply and the frame, no current will flow through the individual. If an electrical leakage path does exist an unsafe amount of electrical current may flow through the individual.

Under normal conditions, only tiny leakage currents on the order of micro amps exist between the terminals of the high voltage power supply and the frame. In other words, the leakage resistance between the terminals of the high voltage power supply and the frame is normally very high. Because the leakage currents are so small, personnel safety is ensured. These small leakage currents may be due mainly to isolated base plates of switching devices in the high voltage DC electrical supply. Additional leakage paths may exist between the motor windings and the frame. In order to ensure personnel safety, it is necessary to check whether an unsafe leakage path has developed.

U.S. Pat. No. 5,382,946 to Gale discloses a circuit for detecting leakage resistance in an electric vehicle between a traction battery and the vehicle frame. The circuit operates by periodically applying an excitation signal from a low voltage excitation source to a capacitor for a selected time period. At the end of the time period, the voltage on the capacitor is measured and compared to a reference voltage. The circuit is configured such that the capacitor charges more slowly if a leakage path exists between the traction battery and the vehicle frame. By measuring the voltage on the capacitor after the selected time period, it can be determined whether a leakage path exists. If the traction battery voltage fluctuates significantly, however, such fluctuation may affect the rate of the charging of the capacitor and thereby cause false output indications.

The present invention provides a leakage detection circuit that avoids some or all of the aforesaid shortcomings in the prior art.

SUMMARY OF THE INVENTION

In accordance with one aspect of the invention, a method for detecting electrical leakage between a power supply and a frame of a vehicle or machine includes electrically coupling a first capacitor between a frame and a first terminal of a power supply for a first predetermined period of time. The current flowing between the frame and the first capacitor is limited to a maximum current limit. It is determined whether a voltage on the first capacitor exceeds a threshold voltage. A first output signal is provided when the voltage on the capacitor exceeds the threshold voltage.

According to another aspect of the present invention, an electrical leakage detection circuit for detecting leakage between a frame and a terminal of a power supply includes a capacitor having a first terminal coupled to a first terminal of the power supply. A current regulator has a first terminal coupled to a second terminal of the first capacitor. The current regulator limits the current flowing through the current regulator to less than a predetermined current limit. A first transistor switch has a first terminal coupled to a second terminal of the current regulator. The first transistor switch also has a second terminal coupled to a frame. A control circuit periodically turns the first transistor switch to an ON condition for a predetermined period of time. The control circuit provides a first output signal when a voltage on the capacitor exceeds a predetermined threshold voltage.

DETAILED DESCRIPTION

Figure 1:
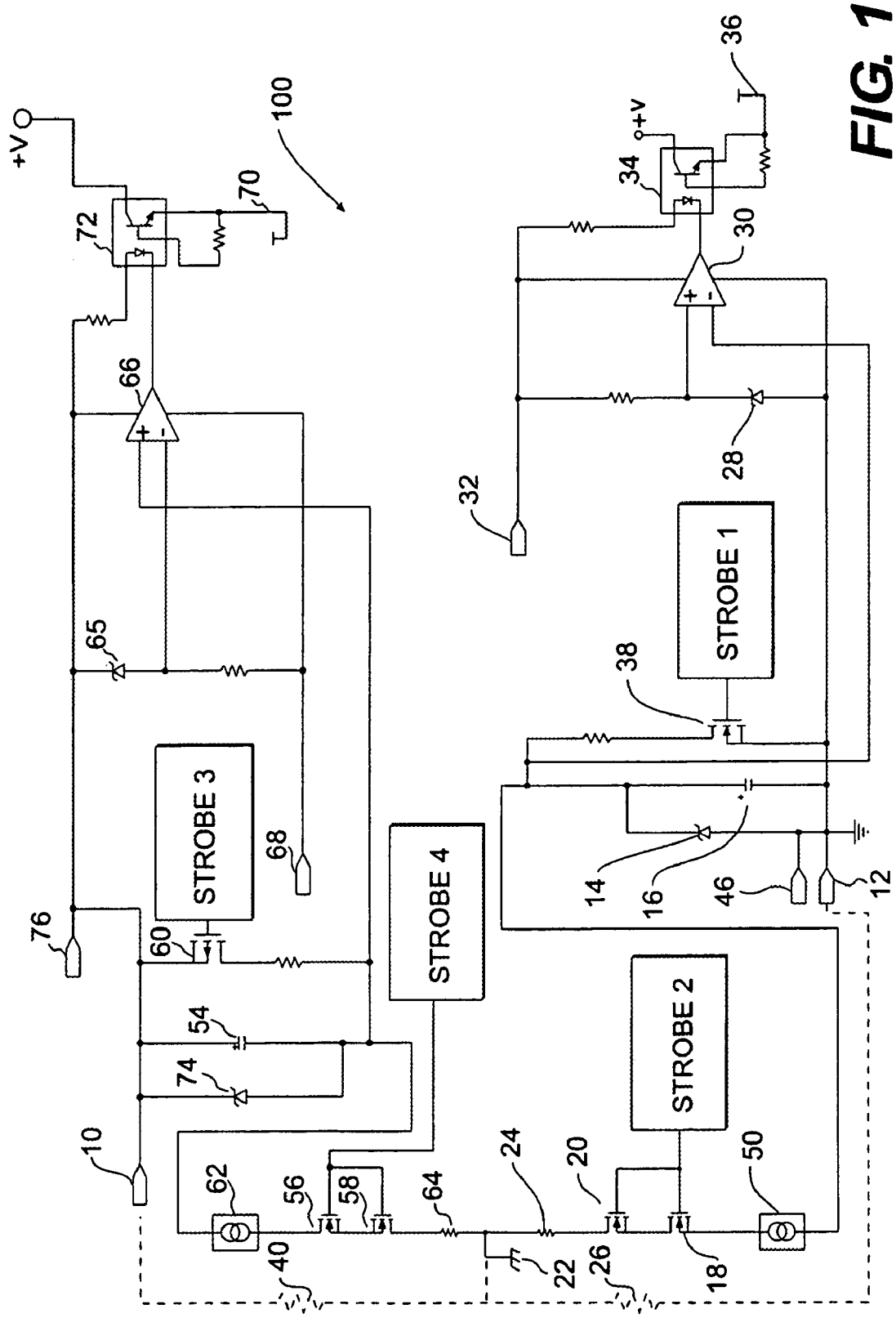
FIG. 1 is an electrical leakage detection circuit according to an exemplary embodiment of the present disclosure.

FIG. 1 illustrates an electrical leakage detection circuit 100 according to an exemplary embodiment of the present disclosure. Electrical leakage detection circuit 100 may be used to detect the presence of an electrical leakage path between a terminal of a high voltage DC power supply and the frame of a vehicle or the frame of a piece of machinery. The word "frame" and "chassis" may be used interchangeably to refer to the conductive housing of the vehicle or machinery containing the high voltage DC power supply.

Electrical leakage detection circuit 100 is used in a vehicle to detect the presence of an unsafe electrical leakage path (i.e. an unacceptably low leakage resistance) between a terminal of a high voltage DC power supply and the frame of the vehicle or machinery containing the power supply. Positive high voltage bus 10 is connected to the positive terminal of the high voltage DC power supply. The high voltage DC power supply could be a generator or a battery. In one embodiment, the high voltage DC power supply is a 340-volt power supply. A high voltage return bus 12 is connected to the negative terminal of the high voltage power supply.

The leakage resistance between positive high voltage bus 10 and a frame 22 is depicted in FIG. 1 as a leakage resistance 40, shown as a dashed line. The leakage resistance between high voltage return bus 12 and frame 22 is depicted as a leakage resistance 26, also shown as a dashed line.

A transistor switch 38 is, for example, an n-channel MOSFET and is turned ON and OFF by a STROBE 1. STROBE 1 is an ON-OFF control signal generated by a control circuit, as are the other STROBE signals shown in FIG. 1. Transistor switch 38 is coupled to the high voltage return bus 12. Initially, STROBE 1 applies a positive voltage to the gate of transistor switch 38, holding transistor switch 38 in an ON condition. This causes a capacitor 16 to have zero voltage across it. In this condition, both sides of capacitor 16 are held at the same potential as the high voltage return bus 12.

To detect if an unsafe electrical leakage path exists between positive high voltage bus 10 and frame 22 (i.e., if leakage resistance 40 is unacceptably low), electrical leakage detection circuit 100 operates as follows. First, STROBE 1 is driven LOW, turning transistor switch 38 to OFF. At the same time, a STROBE 2 goes HIGH, turning transistor switches 18 and 20 to ON. Transistor switches 18 and 20 may be n-channel MOSFETs. Transistor switches 18 and 20 are coupled in series between frame 22 and capacitor 16 (via a current regulator 50). When a positive voltage is applied to the gates of transistor switches 18 and 20 by STROBE 2, transistor switches 18 and 20 are turned ON. It will be understood by one of skill in the art that transistor switches 18 and 20 may be implemented as a single transistor switch or as two or more switches in series. Alternatively, any other conventional switching device may be used.

When transistor switches 18 and 20 are turned ON, capacitor 16 becomes electrically coupled to frame 22; i.e. an electrical current path is established from one terminal of capacitor 16 to frame 22 via a current regulator 50, transistor switches 18 and 20, and a resistor 24. If there is an electrical leakage path between positive high voltage bus 10 and frame 22, the leakage path being represented by leakage resistance 40, then current will begin to flow from power supply positive high voltage bus 10 via frame 22 to capacitor 16. Capacitor 16 will begin charging exponentially with a time constant of RC, wherein C is the capacitance of capacitor 16, and R is the series resistance of leakage resistance 40 plus the resistance of resistor 24 and any other resistance in series with capacitor 16. The lower the leakage resistance 40, the faster that capacitor 16 will charge.

Transistor switches 18 and 20 remain ON for a predetermined amount of time, for example, 1.4 milliseconds. STROBE 2 then is driven LOW, turning OFF transistor switches 18 and 20. At the same time, STROBE 1 is driven HIGH, turning ON transistor switch 38 and discharging capacitor 16. Thus, capacitor 16 is charged for the predetermined amount of time, and at the end of the predetermined period of time, capacitor 16 is discharged.

The voltage on capacitor 16 is continually compared to a predetermined threshold voltage by comparator 30. If the voltage on capacitor 16 exceeds a threshold voltage, then an unsafe leakage condition exists (i.e. leakage resistance 40 is unacceptably low) and an appropriate action will be taken.

Electrical leakage detection circuit 100 may have one or more independent low voltage DC power supplies for supplying power to some of the circuit components. These low voltage DC power supplies may be, for example, 15-volt DC power supplies. FIG. 1 depicts a positive terminal 32 of one of these independent 15-volt power supplies. The negative terminal 46 of this 15-volt power supply (which also can be referred to as the 15-volt return) may be connected to the high voltage return bus 12.

In one embodiment, the independent 15-volt power supplies are generated from a 12-volt battery (not shown). In this embodiment, circuit 100 is implemented in a vehicle that has a 12-volt battery, independent from the high voltage power supply. The negative terminal of the 12-volt battery is bolted to the frame 22 of the vehicle—this is acceptable from a safety standpoint because of the battery's relatively low voltage. Each independent 15-volt power supply is generated by a DC-DC converter that steps up the battery voltage from 12 volts to 15 volts. The DC-DC converter includes a transformer that isolates the 15-volt supply from the 12-volt battery. This isolation is necessary because the negative terminal of the 15-volt power supply may be connected to the high voltage return bus 12, and it is necessary to isolate the 12-volt battery from the high voltage power supply.

A zener diode 28 provides a stable reference voltage of, for example, 5 volts to the non-inverting input of a comparator 30. Current is supplied to zener diode 28 from the positive terminal 32 of the 15-volt power supply. The stable reference voltage supplied by zener diode 28 is the threshold voltage that is compared to the voltage on capacitor 16 at the end of the capacitor charging period. The output of capacitor 16 is applied to the inverting input of comparator 30. Comparator 30 compares the voltage on capacitor 16 with the stable reference voltage supplied by zener diode 28. If the output of capacitor 16 exceeds the stable reference voltage supplied by zener diode 28, the output of comparator goes LOW; otherwise it goes HIGH. When the output of comparator 30 goes LOW, current will flow from the positive terminal 32 of the independent power supply, through an optocoupler 34, to the output of comparator 30. When current flows through optocoupler 34, an LED within optocoupler 34 is turned on, which turns on a light-sensitive transistor at the output of optocoupler 34. This allows current to flow to an output 36 of optocoupler 34.

Optocoupler output 36 is provided to sensing circuitry such as a microprocessor. Optocoupler output 36 could also be coupled to a relay, such that when current flows through output 36, the relay is energized. The purpose of optocoupler 34 is to isolate and thereby protect the sensing circuitry from the high voltage power supply.

The output 36 of optocoupler 34 is continually sensed. When output 36 of optocoupler 34 indicates that comparator output 30 is LOW, then capacitor 16 has charged above the threshold voltage (the stable reference voltage supplied by zener diode 28). This is indicative of an unsafe leakage condition. The capacitance C of capacitor 16 is chosen such that, when an unsafe leakage condition exists (i.e. when leakage resistance 40 is unacceptably low), capacitor 16 will charge to a voltage that exceeds the threshold voltage. In one embodiment, capacitor 16 has a capacitance of 1 microfarad.

When optocoupler output 36 indicates that comparator 30 is LOW, indicative of an unsafe leakage condition, further action can be taken by the control circuit. For example, a warning light or alarm could be energized, and/or the high voltage power supply could be deactivated or tripped. Alternatively, the power supply voltage could be reduced or otherwise switched into a safe mode of operation.

As mentioned above, at the end of the predetermined time period, STROBE 1 goes HIGH thereby discharging capacitor 16, and STROBE 2 goes LOW, turning OFF transistor switches 18 and 20. STROBE 1 remains HIGH, holding transistor switch 38 in an ON condition and keeping a zero voltage across capacitor 16, until the next capacitor charging cycle begins. STROBE 2 also remains low until the next capacitor charging cycle begins.

Resistor 24 acts to reduce the current when capacitor 16 is charging to prevent damage to the circuitry in the event that positive high voltage bus 10 were to become directly shorted (i.e. shorted with very low resistance) to frame 22. Resistor 24 has a fairly low resistance such as 5 kiloohms. If the high voltage return bus 12 were to be shorted to the frame 22 (i.e. leakage resistance 40 would be almost zero), a large current would flow when transistor switches 18 and 20 were switched ON. This could cause damage to circuitry such as transistor switches 18 and 20 and capacitor 16. Thus, resistor 24 reduces the current and prevents damage to these components in such a situation. Resistor 24 also acts with capacitor 16 to form a low frequency pole to filter out high frequency noise on the frame that may interfere with circuit operation.

A current regulator 50 provides an important safety feature for the disclosed system. If an individual were to simultaneously touch positive high voltage bus 10 and frame 22 when transistor switches 18 and 20 are turned ON, a brief pulse of current might flow through the individual while transistor switches 18 and 20 remain ON. The amount of current will be determined by the resistance of the individual, which is dependent on a number of factors such as the moisture on the individual's hands and the tightness of his or her grip. The individual could receive, for example, 17 milliamps of current for 1.4 milliseconds.

Current regulator 50 provides a safety feature that addresses this problem. Current regulator 50 prevents the current flowing from frame 22 to capacitor 16 from exceeding a specified maximum current limit, for example 8–12 milliamps. Once the current reaches this maximum current limit, current regulator 50 prevents further increase of the current beyond this maximum limit. This prevents a person from receiving more than the maximum current limit. It should be noted that it may not be desirable to use a resistor in lieu of current regulator 50. Although a resistor reduces current levels, it does not limit current to less than a maximum limit. If a resistor were used in lieu of current regulator 50, the current could exceed the maximum specified limit, especially if the voltage on the positive high voltage bus 10 fluctuates to a higher than normal level. Thus, current regulator 50 provides a significant safety feature.

A zener diode 14 prevents damage to capacitor 16 by preventing the voltage on capacitor 16 from rising above a specified voltage, for example 10 volts. Once this specified voltage is exceeded, the zener diode 14 begins to conduct to limit further voltage increase across capacitor 16.

An unsafe electrical leakage path between frame 22 and high voltage return bus 12 can be detected in a similar manner by periodically charging a capacitor 54. This operation will now be described. Transistor switch 60 is, for example, a p-channel MOSFET. The source of transistor switch 60 is coupled to positive high voltage bus 10. Because transistor switch 60 is a p-channel MOSFET, it is turned ON when STROBE 3 is driven LOW and turned OFF when STROBE 3 is driven HIGH.

STROBE 3 is initially LOW, holding transistor switch 60 in an ON condition. Thus, there is zero voltage potential across capacitor 54. To detect if an unsafe electrical leakage path exists between high voltage return bus 12 and frame 22 (i.e., if leakage resistance 26 is unacceptably low), STROBE 3 is driven HIGH, switching transistor switch 60 to an OFF condition. At the same time, a STROBE 4 goes HIGH, turning transistor switches 56 and 58 to ON. When transistor switches 56 and 58 are turned ON, capacitor 54 becomes electrically coupled to frame 22; i.e. an electrical current path is established from one terminal of capacitor 54 to frame 22 via a current regulator 62, transistor switches 56 and 58, and a resistor 64. If there is an electrical leakage path between high voltage return bus 12 and frame 22 (the leakage path is represented by leakage resistance 26), then current will begin to flow from capacitor 54 to high voltage return bus 12 via frame 22. Capacitor 54 will initially start at a voltage equal to the positive high voltage bus 10. The voltage on capacitor 54 will drop exponentially with a time constant of RC, wherein C is the capacitance of capacitor 54, and R is the series resistance of leakage resistance 26 plus the resistance of resistor 24 and any other resistance in series with capacitor 54. The lower the leakage resistance 26, the faster that the voltage on capacitor 54 will drop.

Transistor switches 56 and 58 remain ON for a predetermined amount of time, for example, 1.4 milliseconds. While transistor switches 56 and 58 are turned ON, the voltage on capacitor 54 drops exponentially as current flows from capacitor 54 to high voltage return bus 12 via frame 22 and leakage resistance 26. STROBE 4 then goes LOW turning OFF transistor switches 56 and 58, and STROBE 3 goes LOW, turning on transistor switch 60. This will return both sides of capacitor 54 to the same potential as positive high voltage bus 10.

A zener diode 65 provides a stable reference voltage to the inverting input of a comparator 66. For example, zener diode 65 provides a voltage that is 5 volts less than the positive high voltage bus 10. In this example, if the positive high voltage bus 10 is at +340 volts, then 335 volts is supplied to the inverting input of comparator 66. The output of capacitor 54 is coupled to the non-inverting input of comparator 66.

Current is supplied to zener diode 65 from a positive terminal 76 of an independent DC power supply having a voltage of, for example, 15 volts. The return of this independent DC power supply is represented by a negative terminal 68. Positive terminals 32 and 76 are generated by different independent DC power supplies.

Comparator 66 compares the voltage supplied by zener diode 65 with the voltage supplied by capacitor 54. If the voltage on capacitor 54 drops by more than a threshold voltage amount, for example 5 volts, then the output of comparator 66 will go LOW. If the output 70 of optocoupler 72 indicates that the output of comparator 66 is LOW, then an unsafe leakage path exists between the frame and high voltage return bus 12. In such an event, an appropriate action can be taken, as described previously.

Resistor 64, a zener diode 74, and current regulator 62 provide a similar function to their counterparts: resistor 24, zener diode 14, and current regulator 50, respectively. The timing of STROBE 1, STROBE 2, STROBE 3 and STROBE 4 can be controlled by a microprocessor. Alternatively, the timing of the four STROBE signals can be controlled by a series of 555 timers or any other well known control circuit.

INDUSTRIAL APPLICABILITY

Operation of both halves of electrical leakage detection circuit 100 will now be described. Initially, STROBE 1 is HIGH, STROBE 2 is LOW, STROBE 3 is LOW, and STROBE 4 is LOW. Both capacitor 16 and capacitor 54 are thus held in a discharged state (i.e. no voltage across the capacitors) and no current is flowing into or out of either capacitor. STROBE 1 then goes LOW and STROBE 2 goes HIGH. This begins the charging of capacitor 16. Capacitor 16 is charged for a predetermined period of time, for example 1.4 milliseconds. The voltage on capacitor 16 is continuously compared to the threshold voltage. The output 36 of optocoupler 34 is continually sensed. If output 36 of optocoupler 34 indicates that the output of comparator 30 is LOW, then an unsafe leakage condition exists and an appropriate action is taken, as described previously. At the end of the predetermined time period, STROBE 2 goes LOW, and STROBE 1 goes HIGH, discharging capacitor 16. STROBE 1 remains HIGH and STROBE 2 remains LOW until the next charging cycle for capacitor 16.

Next, STROBE 3 is driven HIGH and STROBE 4 is driven HIGH, and current begins to flow from capacitor 54 to frame 22. The output 70 of optocoupler 72 is continually sensed. If the output 70 of optocoupler 72 indicates that the output of comparator 66 is LOW, then an unsafe leakage condition exists and an appropriate action is taken. At the end of a predetermined period of time, for example 1.4 milliseconds, STROBE 4 is driven LOW and STROBE 3 is driven LOW.

After leakage detection is thus performed for both high voltage buses 10 and 12, the circuit 100 remains idle for a predetermined time period, for example 100 milliseconds. Then leakage detection for both buses is repeated. During the period where circuit 100 is idle, STROBE 1 is HIGH, STROBE 2 is LOW, STROBE 3 is LOW and STROBE 4 is LOW. Thus, in one embodiment, circuit 100 operates by charging capacitor 16 for 1.4 milliseconds, then charging capacitor 54 for 1.4 milliseconds, then waiting 100 milliseconds, and repeating.

It is intended that the specification and examples be consider as exemplary only, with a true scope of the invention being indicated by the following claims.

What is claimed is:

1. A method for detecting electrical leakage between a power supply and a frame, comprising:
   actuating a transistor switch to connect a first capacitor between the frame and a first terminal of the power supply for a first predetermined period of time;
   limiting the current flowing between the frame and the first capacitor to less than a predetermined current limit;
   determining if a voltage on the first capacitor exceeds a threshold voltage; and
   providing a first output signal when the voltage on the first capacitor exceeds the threshold voltage,
   wherein the transistor switch is coupled in series between the first capacitor and the frame.

2. The method of claim 1, further including:
   electrically coupling a second capacitor between the frame and a second terminal of the power supply for the predetermined period of time;
   limiting the current flowing between the frame and the second capacitor to less than a predetermined current limit;
   determining if a voltage on the second capacitor exceeds a threshold voltage; and
   providing a second output signal when a voltage on the second capacitor exceeds the threshold voltage.

3. The method of claim 1, further including:
   limiting the voltage on the first capacitor to a predetermined voltage limit.

4. The method of claim 1, wherein the determining if the voltage on the first capacitor exceeds a predetermined threshold includes comparing the voltage on the first capacitor to a stable reference voltage.

5. The method of claim 1, wherein the limiting of the current flowing between the frame and the first capacitor is performed by a current regulator.

6. The method of claim 5, wherein the current regulator limits the current flowing between the frame and the first capacitor to 8 to 12 milliamps.

7. The method of claim 5, wherein the current regulator limits the current flowing between the frame and the first capacitor to a current limit that is safe for a human being to receive for the predetermined time period.

8. The method of claim 1, further including:
   holding the first capacitor in a discharged condition when the first capacitor is not connected between the frame and the first terminal of the power supply.

9. The method of claim 1, wherein the power supply includes a second terminal, the method further including:
   electrically isolating the first output signal from the first and second terminals of the power supply and from circuitry coupled to the terminals of the power supply.

10. The method of claim 9, wherein the isolating is performed by an optocoupler.

11. The method of claim 1, further including:
    reducing the current flowing between the frame and the first capacitor with a resistor, thereby providing circuit protection in the event that a second terminal of the power supply becomes shorted to the frame.

12. The method of claim 1, wherein the frame is a frame of a vehicle or a machine.

13. The method of claim 1, further including:
    providing a response based on the first output signal, wherein the response comprises at least one of energizing a warning light, activating an alarm, disconnecting the power supply, deactivating the power supply, and placing the power supply in a safe condition.

14. An electrical leakage detection circuit for detecting electrical leakage between a frame and a terminal of a power supply, comprising:
    a capacitor having a first terminal coupled to a first terminal of the power supply;
    a current regulator having a first terminal coupled to a second terminal of the first capacitor, wherein the current regulator limits the current flowing through the current regulator to less than a predetermined current limit;
    a first transistor switch having a first terminal coupled to a second terminal of the current regulator, the first transistor switch having a second terminal coupled to a frame; and
    a control circuit for periodically turning the first transistor switch to an ON condition for a predetermined period of time, and providing a first output signal when a voltage on the capacitor exceeds a predetermined threshold voltage.

15. The electrical leakage detection circuit of claim 14, wherein the first transistor switch includes a plurality of transistor switches connected in series.

16. The electrical leakage detection circuit of claim 14, further including:
    a zener diode for generating the predetermined threshold voltage.

17. The electrical leakage detection circuit of claim 14, further including:
    an optocoupler for isolating the output signal from the power supply.

18. The electrical leakage detection circuit of claim 14, further including:
    a second transistor switch for holding the capacitor in a discharged condition when the first transistor switch is in an OFF condition.

19. The electrical leakage detection circuit of claim 14, further comprising:
    a comparator for comparing the voltage on the capacitor with the predetermined threshold voltage.

* * * * *